(12) United States Patent
Yoshikawa (10) Patent No.: US 10,734,402 B2
(45) Date of Patent: Aug. 4, 2020

(54) SEMICONDUCTOR DEVICE AND METHOD OF FABRICATING THE SAME

(71) Applicant: TOSHIBA MEMORY CORPORATION, Minato-ku, Tokyo (JP)

(72) Inventor: Kenichi Yoshikawa, Yokkaichi Mie (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 0 days.

(21) Appl. No.: 15/909,371

(22) Filed: Mar. 1, 2018

(65) Prior Publication Data

US 2019/0074288 A1 Mar. 7, 2019

(30) Foreign Application Priority Data

Sep. 7, 2017 (JP) ................................. 2017-172184

(51) Int. Cl.
| | | |
|---|---|---|
| *H01L 21/3213* | (2006.01) | |
| *H01L 27/11582* | (2017.01) | |
| *H01L 27/11556* | (2017.01) | |
| *H01L 27/11575* | (2017.01) | |
| *H01L 27/1157* | (2017.01) | |
| *H01L 21/311* | (2006.01) | |

(52) U.S. Cl.
CPC .... *H01L 27/11582* (2013.01); *H01L 21/3213* (2013.01); *H01L 27/1157* (2013.01); *H01L 27/11556* (2013.01); *H01L 27/11575* (2013.01); *H01L 21/31116* (2013.01); *H01L 21/31144* (2013.01)

(58) Field of Classification Search
CPC ......... H01L 27/11582; H01L 21/31116; H01L 21/32136; H01L 23/3171; H01L 21/67069; H01L 21/31122; H01L 21/32137; H01L 27/11556; H01L 23/291
See application file for complete search history.

(56) References Cited

U.S. PATENT DOCUMENTS

| | | | |
|---|---|---|---|
| 7,595,236 B2 | 9/2009 | Isogai | |
| 8,696,875 B2 | 4/2014 | Ding et al. | |
| 9,281,217 B1* | 3/2016 | Jung | ................. H01L 21/47573 |
| 9,496,274 B2* | 11/2016 | Pachamuthu | ..... H01L 27/11551 |
| 9,929,177 B2* | 3/2018 | Nagumo | ............ H01L 27/1157 |
| 2006/0003577 A1 | 1/2006 | Sone | |

(Continued)

OTHER PUBLICATIONS

Joseph M Galvin III, Non-Final Rejection of Child Application U.S. Appl. No. 16/230,244, dated Dec. 31, 2019. (Year: 2019).*

(Continued)

*Primary Examiner* — Joseph M Galvin, III
(74) *Attorney, Agent, or Firm* — Foley & Lardner LLP (57) ABSTRACT

A method of fabricating a semiconductor device is described. A plurality of first films and a plurality of second films are alternately formed on a substrate. A hole is formed in the first and second films. A first metal layer is formed on a surface of the hole. The first metal layer is removed from a bottom surface of the hole. A second metal layer may be formed on a surface of the first metal layer after removing the first metal layer from the bottom surface of the hole. The bottom of the hole exposed from the first and second metal layers may be processed to increase a depth of the hole.

15 Claims, 10 Drawing Sheets

(56) References Cited

U.S. PATENT DOCUMENTS

| | | | |
|---|---|---|---|
| 2009/0275202 A1 | 11/2009 | Tanaka et al. | |
| 2012/0199949 A1* | 8/2012 | Lan | H01G 4/012 |
| | | | 257/534 |
| 2014/0273462 A1* | 9/2014 | Simsek-Ege | H01L 21/0334 |
| | | | 438/696 |
| 2015/0357413 A1* | 12/2015 | Zhang | H01L 29/1029 |
| | | | 257/324 |
| 2017/0250193 A1* | 8/2017 | Huo | H01L 21/3247 |
| 2017/0263611 A1* | 9/2017 | Imamura | H01L 21/31144 |
| 2017/0330764 A1* | 11/2017 | Lai | H01J 37/32082 |

OTHER PUBLICATIONS

Final Office Action on U.S. Appl. No. 16/230,244 dated Jun. 17, 2020.

* cited by examiner

SEMICONDUCTOR DEVICE AND METHOD OF FABRICATING THE SAME

CROSS-REFERENCE TO RELATED APPLICATION

This application claims the benefit of and priority to Japanese Patent Application No. 2017-172184, filed Sep. 7, 2017, the entire contents of which are incorporated herein by reference.

FIELD

Embodiments described herein relate generally to a semiconductor device and a method of fabricating the same.

BACKGROUND

In recent years, there are many cases of processing holes with a high aspect ratio during fabricating a three-dimensional semiconductor memory. In this case, there is a problem that the hole is deformed in an arcuate shape (bowing shape) as the processing time increases. For this reason a protective film may be formed on a surface of the hole at the time of processing the hole. When the etching resistance of the protective film is too low, however, the protective film may be chipped off. Further, when the etching resistance of the protective film is too high, the protective film may block the hole.

DETAILED DESCRIPTION

Exemplary embodiments provide a semiconductor device capable of appropriately providing a structure with a high aspect ratio and a method of fabricating the semiconductor device.

According to embodiments, a method of fabricating a semiconductor device comprising: forming alternately a plurality of first films and a plurality of second films on a substrate; forming a hole in the first and second films; forming a first metal layer on a surface of the hole; and removing the first metal layer from a bottom of the hole. The method further includes forming a second metal layer on a surface of the first metal layer after removing the first metal layer from the bottom of the hole. The method further includes processing the bottom of the hole exposed from the first and second metal layers to increase a depth of the hole.

Exemplary embodiments of the present disclosure will be described with reference to the drawings.

First Embodiment

Figure 1:
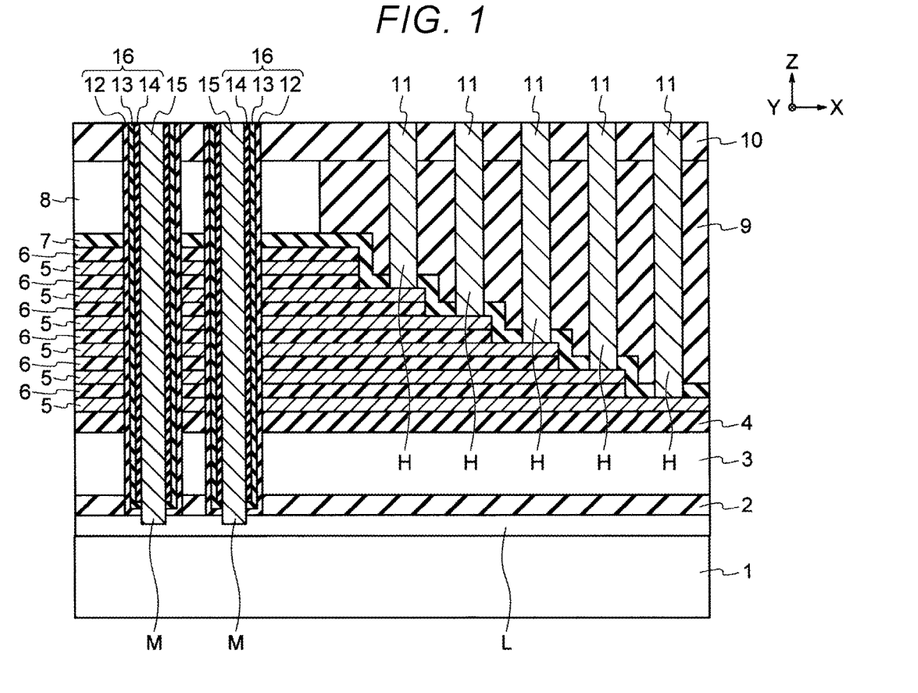
FIG. 1 is a cross-sectional view illustrating a structure of a semiconductor device according to a first embodiment.

FIG. 1 is a cross-sectional view illustrating a configuration of a semiconductor device according to a first embodiment. The semiconductor device illustrated in FIG. 1 includes a three-dimensional semiconductor memory.

The semiconductor device illustrated in FIG. 1 includes a substrate 1, a first insulating film 2, a source-side conductive layer 3, a second insulating film 4, a plurality of electrode layers 5, a plurality of insulating layers 6, a third insulating film 7, a drain-side conductive layer 8, a first interlayer insulating film 9, a second interlayer insulating film 10, a plurality of contact plugs 11, a first memory insulating film 12, a charge storage layer 13, a second memory insulating film 14, and a channel semiconductor layer 15.

The substrate 1 may be a semiconductor substrate, for example, such as a silicon substrate. FIG. 1 illustrates an X direction and a Y direction which are parallel to the surface of the substrate 1 and perpendicular to each other, and a Z direction perpendicular to the surface of the substrate 1. In the specification, the +Z direction is regarded as an upward direction and the −Z direction is regarded as a downward direction. The −Z direction may or may not coincide with the direction of gravity.

The first insulating film 2 is formed on a diffusion layer L which is formed in the substrate 1. The source-side conductive layer 3 is formed on the first insulating film 2. The second insulating film 4 is formed on the source-side conductive layer 3.

The plurality of electrode layers 5 and the plurality of insulating layers 6 are alternately stacked on the second insulating film 4. The electrode layer 5 may be, for example, a metal layer, and functions as a word line or a selection line. The number of electrode layers 5 to be stacked may be, for example, 64 or more. The electrode layer 5 is an example of a first film. The insulating layer 6 may be, for example, a silicon oxide film. The number of insulating layers 6 to be stacked is, for example, 64 or more. The insulating layer 6 is an example of a second film. FIG. 1 illustrates memory holes M penetrating through the electrode layers 5 and the insulating layers 6 and contact holes H formed on staircase regions of the electrode layers 5 and the insulating layers 6.

The third insulating film 7 is formed on the electrode layer 5 and the insulating layer 6. The drain-side conductive layer 8 is formed on the third insulating film 7 so as to be adjacent to the staircase region. The first interlayer insulating film 9 is formed on the third insulating film 7 so as to embed a space above the staircase region. The second interlayer insulating film 10 is formed on the drain-side conductive layer 8 and the first interlayer insulating film 9.

The plurality of contact plugs 11 are formed in the contact holes H penetrating through the third insulating film 7, the first interlayer insulating film 9, and the second interlayer insulating film 10. These contact plugs 11 are electrically connected to the different electrode layers 5. Each of the contact plugs 11 may be formed of, for example, a barrier metal layer such as a titanium-containing layer and a plug material layer such as a tungsten layer.

The first memory insulating film 12, the charge storage layer 13, and the second memory insulating film 14 are sequentially formed on a side surface of the memory hole M penetrating through the first insulating film 2, the source-side conductive layer 3, the second insulating film 4, the electrode layer 5, the insulating layer 6, the third insulating film 7, the drain-side conductive layer 8, and the second interlayer insulating film 10. The first memory insulating film 12 may be, for example, a silicon oxide film. The charge storage layer 13 may be, for example, a silicon nitride film. The second memory insulating film 14 may be, for example, a silicon oxide film. In FIG. 1, reference numeral 16 represents a memory insulating film including the first memory insulating film 12, the charge storage layer 13, and the second memory insulating film 14. However, the charge storage layer 13 may be a semiconductor layer such as a polysilicon layer.

The channel semiconductor layer 15 is formed in the memory hole M via the memory insulating film 16, and is electrically connected to the substrate 1. The channel semiconductor layer 15 may be, for example, a polysilicon layer.

For example, the channel semiconductor layer 15 is formed in such a manner that the first memory insulating film 12, the charge storage layer 13, and the second memory insulating film 14 are sequentially formed on the side surface and the bottom surface of the memory hole M; the second memory insulating film 14, the charge storage layer 13, and the first memory insulating film 12 are removed from the bottom surface of the memory hole M; and then the channel semiconductor layer 15 is embedded in the memory hole M.

FIGS. 2A to 2C and FIGS. 3A to 3C are cross-sectional views illustrating a method of fabricating the semiconductor device according to the first embodiment.

Figure 2A:
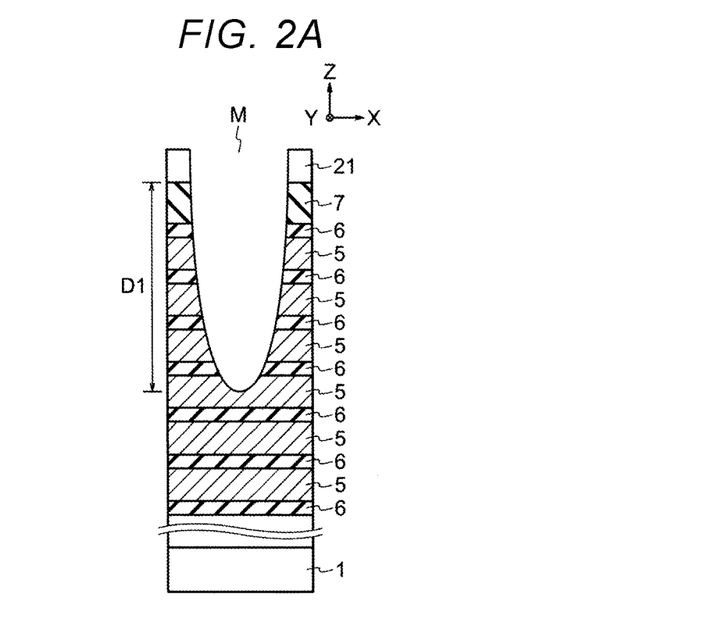
FIGS. 2A to 2C are cross-sectional views (first stage) illustrating a method of fabricating the semiconductor device according to the first embodiment.

First, the plurality of electrode layers 5 and the plurality of insulating layers 6 are alternately formed on the entire surface of the substrate 1 via the first insulating film 2, the source-side conductive layer 3, and the second insulating film 4 (see FIG. 2A). The first insulating film 2, the source-side conductive layer 3, and the second insulating film 4 are not illustrated for convenience.

Next, a mask layer 21 is formed on the entire surface of the substrate 1 via the third insulating film 7, the drain-side conductive layer 8, the first interlayer insulating film 9, and the second interlayer insulating film 10 (see FIG. 2A). The mask layer 21 may be, for example, a carbon layer formed by a chemical vapor deposition (CVD). The drain-side conductive layer 8, the first interlayer insulating film 9, and the second interlayer insulating film 10 are not illustrated for convenience.

Subsequently, the electrode layer 5 and the insulating layer 6 are etched by reactive ion etching (RIE) using the mask layer 21 to form the memory hole M in the electrode layer 5 and the insulating layer 6 (see FIG. 2A). However, there is a problem that the hole is deformed in an arcuate shape as an etching time becomes longer. Therefore, the RIE is completed before the memory hole M reaches the second insulating film 4. Reference numeral D1 represents a depth of the memory hole M from a lower surface of the mask layer 21 in the stage of FIG. 2A.

In the stage of FIG. 2A, a sacrifice layer may be formed between the insulating layers 6 instead of the electrode layer 5. The sacrifice layer is, for example, a silicon nitride film. In this case, the sacrifice layer is removed in the subsequent stage, and the electrode layer 5 is embedded between insulating layers 6. The sacrifice layer is also an example of the second film.

Figure 2B:
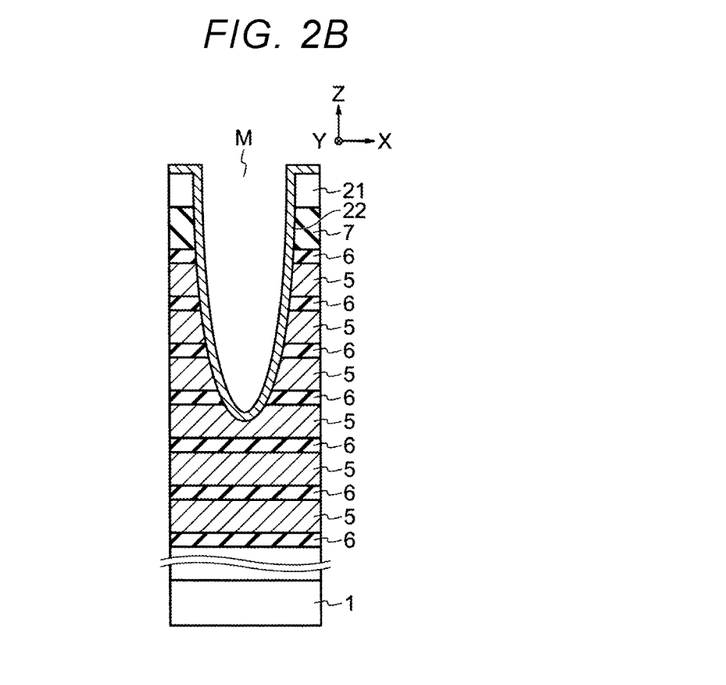

Next, a first metal layer 22 is formed on the surface of the memory hole M by CVD or ALD (Atomic Layer Deposition), for example (see FIG. 2B). In the first embodiment, the first metal layer 22 is formed under a condition of being conformally formed on the surface of the memory hole M. An example of the material of the first metal layer 22 is a metal material generally used as a barrier metal layer. For example, the first metal layer 22 may be a titanium nitride film (TiN), a tantalum nitride film (TaN), or a tungsten nitride film (WN).

Figure 2C:
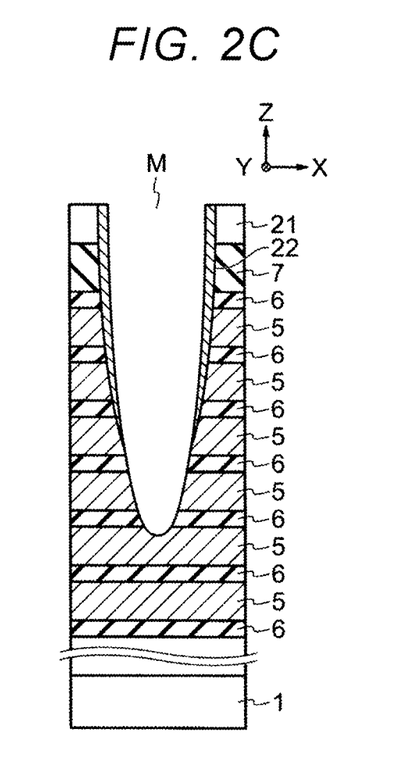

Next, the first metal layer 22 is removed from the bottom of the memory hole M by RIE (see FIG. 2C). The RIE is performed under conditions that the first metal layer 22 remains on the side surface of the memory hole M and the first metal layer 22 is removed from the bottom of the memory hole M.

Subsequently, a second metal layer 23 is formed on the surface of the first metal layer 22 by CVD or ALD (see FIG. 3A), for example. In the first embodiment, an example of the material of the second metal layer 23 is a metal material generally used as a plug material layer or a wiring material layer. For example the second metal layer 23 may be a tungsten (W) layer or an aluminum (Al) layer.

Generally, the barrier metal layer has a property of being capable of being etched by RIE and a property of having good adhesion with the plug material layer or the wiring material layer. For this reason, the first metal layer 22 is etched in a stage of FIG. 2C, and the second metal layer 23 is selectively formed on the surface of the first metal layer 22 in a stage of FIG. 3A. In the first embodiment, the second metal layer 23 is formed as a protective film for preventing the hole from being deformed in an arcuate shape. The first metal layer 22 of the first embodiment is formed as an adhesion film for adhering the second metal layer 23.

Figure 3A:
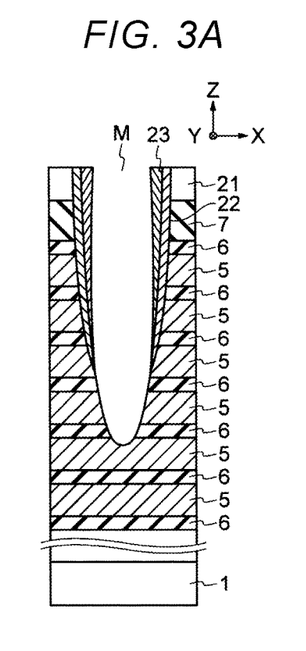
FIGS. 3A to 3C are cross-sectional views (second stage) illustrating the method of fabricating the semiconductor device according to the first embodiment.
Figure 3B:
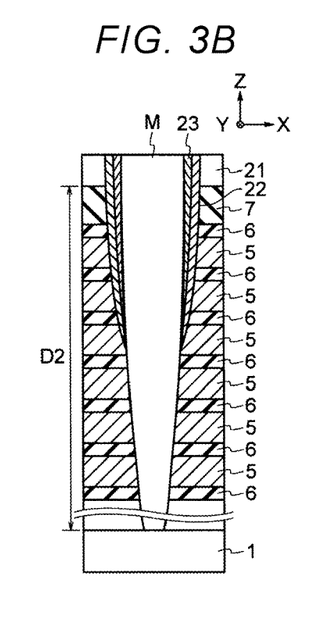

Next, the bottom of the memory hole M exposed from the first and second metal layers 22 and 23 is etched by RIE to increase the depth of the memory hole M (see FIG. 3B). At this time, since the side surface of the memory hole M is protected by the second metal layer 23, the hole is prevented from being deformed in an arcuate shape. In addition, since the second metal layer 23 does not exist on the bottom of the memory hole M, the second metal layer 23 is not obstructive to the etching of the bottom of the memory hole M. The RIE is continued until the memory hole M reaches the substrate 1. Reference numeral D2 represents a depth of the memory hole M from the lower surface of the mask layer 21 in the stage of FIG. 3B.

A ratio D1/D2 of the depth D1 and the depth D2 may be arbitrarily set. For example, it is considered that the ratio D1/D2 is set to about 1/4 to 1/2. In the first embodiment, an etching time in the stage of FIG. 2A is adjusted so that the depth D1 becomes a desired value.

Figure 3C:
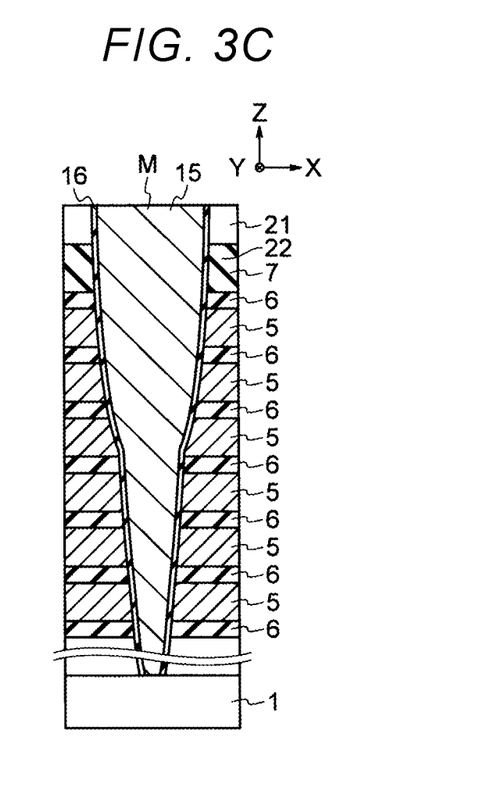

Next, the first and second metal layers 22 and 23 are removed from the memory hole M, and the memory insulating film 16 and the channel semiconductor layer 15 are sequentially formed in the memory hole M (see FIG. 3C). Specifically, the memory insulating film 16 is formed on the surface of the memory hole M, the memory insulating film 16 is removed from the bottom surface of the memory hole M, and the channel semiconductor layer 15 is formed in the memory hole M via the memory insulating film 16.

The stages of FIGS. 2A to 3C may be applied to the contact hole H instead of the memory hole M. This is effective, for example, when the contact hole H is formed to penetrate through the plurality of electrode layers 5 and the plurality of insulating layers 6.

Figure 4A:
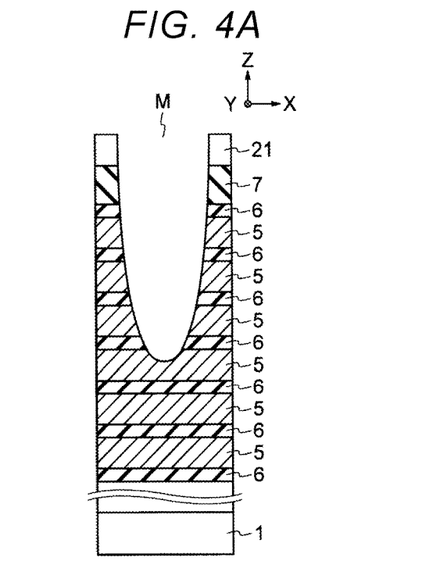
FIGS. 4A to 4C are cross-sectional views illustrating a method of fabricating a semiconductor device according to a comparative example of the first embodiment.
Figure 4B:
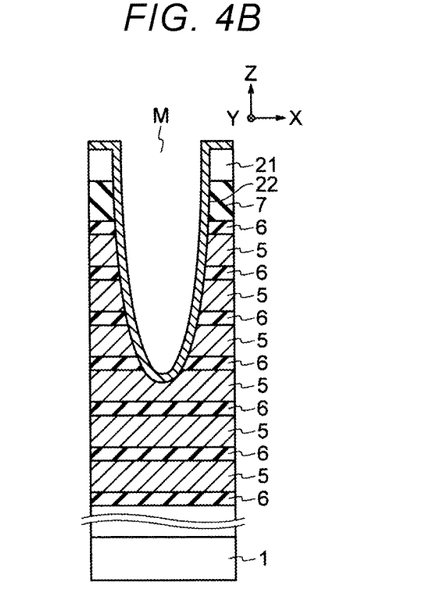
Figure 4C:
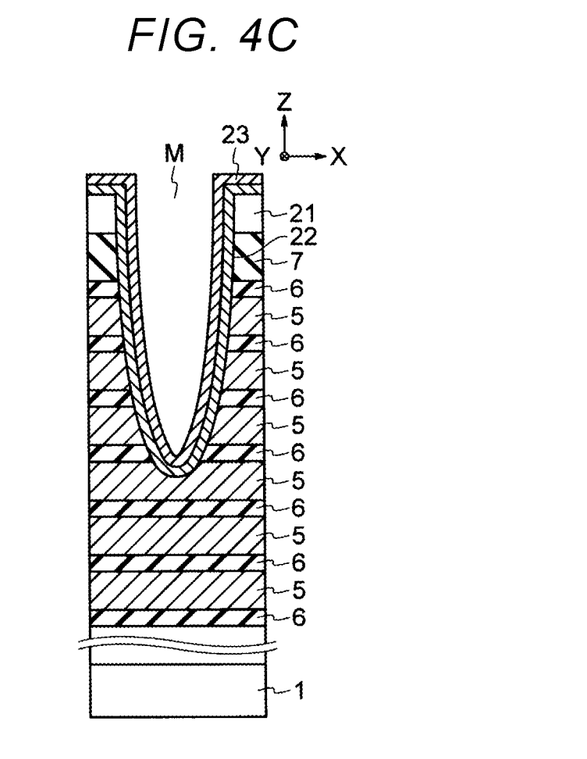

FIG. 4 is a cross-sectional view illustrating a semiconductor device according to a comparative example of the first embodiment.

Stages of FIGS. 4A and 4B are carried out in the same way as the stages of FIGS. 2A and 2B. In a stage of FIG. 4C, However, the second metal layer 23 is formed in a state where the first metal layer 22 is not removed from the bottom of the memory hole M. Accordingly, when the thickness of the second metal layer 23 increases, problems occur where the second metal layer 23 can not easily be removed from the bottom of the memory hole M and the etching of the memory hole M is not easily continued.

On the other hand, after the first metal layer 22 is removed from the bottom of the memory hole M, the second metal layer 23 of the first embodiment is selectively formed on the surface of the remaining first metal layer 22 (see FIGS. 2C and 3A). Therefore, the second metal layer 23 hardly obstructs the etching of the memory hole M. According to the first embodiment, it is not necessary to remove the second barrier layer 23 from the bottom of the memory hole M, and the second metal layer 23 can be thickened.

Figure 5A:
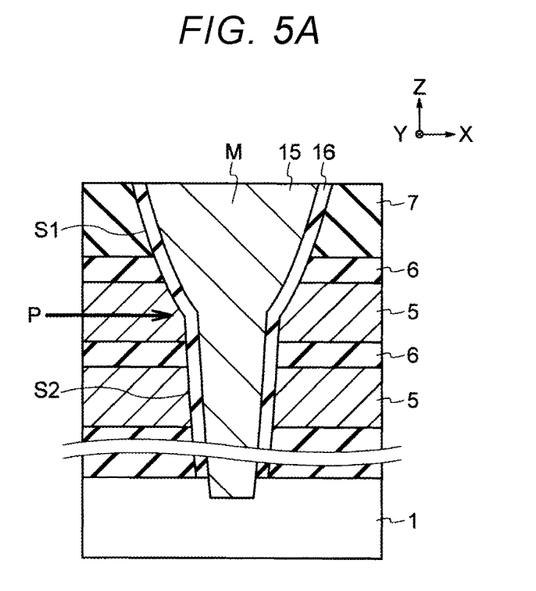
FIGS. 5A and 5B are schematic cross-sectional views for explaining in detail the method of fabricating the semiconductor device according to the first embodiment.
Figure 5B:
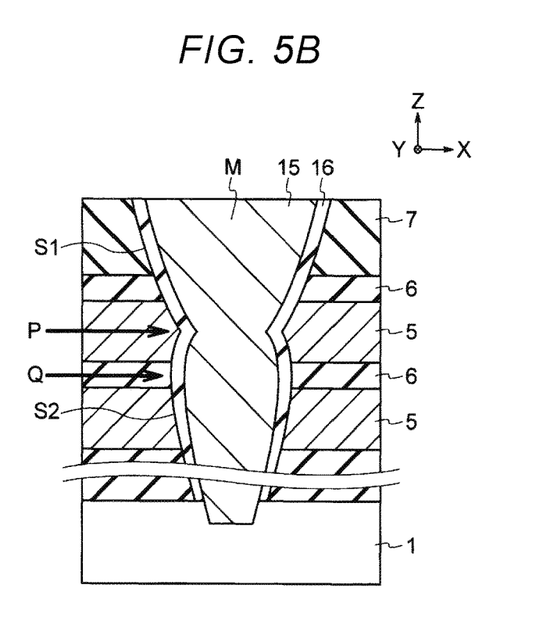

FIGS. 5A and 5B are schematic cross-sectional views for explaining the details of the fabricating method of the semiconductor device according to the first embodiment.

FIG. 5A schematically illustrates the memory hole M after the stage of FIG. 3C. The side surface of the memory hole M, that is, the side surface of the electrode layer 5 and the insulating layer 6 surrounding the channel semiconductor layer 15 and the memory insulating film 16, has a tubular shape. A diameter of the tubular shape changes depending on a depth (Z coordinate), and FIG. 5A illustrates this change in an exaggerating manner.

In the first embodiment, the side surface of the memory hole M includes a first side surface S1 formed by the first RIE in FIG. 2A and a second side surface S2 formed by the second RIE in FIG. 3B. Both of the first side surface S1 and the second side surface S2 have a tubular shape, and the second side surface S2 is located below the first side surface S1.

In the first embodiment, the etching of the memory hole M is switched from the first RIE to the second RIE between the first side surface S1 and the second side surface S2. This causes an inflection point (inflection portion) P to occur between the first side surface S1 and the second side surface S2. For example, the inflection point P can be observed as a seam line (circle) between the first side surface S1 and the second side surface S2. Further, when the seam has a width in the Z direction, a seam band (cylinder) can be observed.

FIG. 5B also schematically illustrates the memory hole M after the stage of FIG. 3C. However, FIG. 5B illustrates an example in which the second side surface S2 is formed in an arcuate shape by the second RIE. Reference numeral Q represents a depth at which the diameter of the second side surface S2 becomes maximum. The diameter at the depth Q is larger than the diameter at the inflection point P.

As described above, the side surface of the memory hole M of the first embodiment can also have an arcuate shape, but according to the first embodiment, the maximum diameter of the side surface of the memory hole M can be reduced. In the example of FIG. 5B, the maximum diameter of the first side surface S1 is a diameter at an upper end of the memory hole M (hereinafter, referred to as a "first diameter"), and the maximum diameter of the second side surface S2 is a diameter at the depth Q (hereinafter, referred to as a "second diameter"). If when the memory hole M is formed without using the first and second metal layers 22 and 23, the maximum diameter of the side surface of the memory hole M is generally larger than the first diameter and the second diameter. According to the first embodiment, it is possible to reduce the maximum diameter of the side surface of the memory hole M.

In the first embodiment, the RIE may be performed three or more times to process the memory hole M. In this case, after the first and second metal layers 22 and 23 are removed from the memory hole M in the stage of FIG. 3C, the first and second metal layers 22 and 23 are formed again on the side surface of the memory hole M and a third RIE is performed. The same applies to subsequent RIE.

Figure 6:
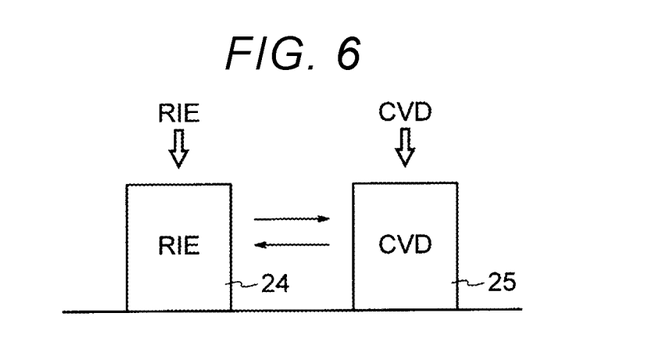
FIG. 6 is a schematic diagram for explaining the method of fabricating the semiconductor device according to the first embodiment.

FIG. 6 is a schematic diagram illustrating the method of fabricating the semiconductor device according to the first embodiment.

FIG. 6 illustrates an RIE apparatus 24 for performing RIE and a CVD apparatus 25 for performing CVD. The RIE processes in the stages of FIGS. 2A, 2C, and 3B of the first embodiment are performed in the RIE apparatus 24. On the other hand, the CVD processes in the stages of FIGS. 2B and 3A of the first embodiment are performed in the CVD apparatus 25.

In the first embodiment as described above, an ex-situ process is performed in which the RIE apparatus 24 is opened to the atmosphere during the RIE process and the first metal layer 22 and the second metal layer 23 are formed by the CVD apparatus 25. According to the first embodiment, it is possible to form the first and second metal layers 22 and 23 with good film quality, as compared with an in-situ process to be described below.

In the first embodiment as described above, the first metal layer 22 is formed on the surface of the memory hole M, the first metal layer 22 is removed from the bottom of the memory hole, and then the second metal layer 23 is formed on the surface of the remaining first metal layer 22. This makes it possible to prevent the second metal layer 23 from obstructing the etching of the memory hole M and to reduce the maximum diameter of the side surface of the memory hole M. Further, when the maximum diameter of the side surface of the memory hole M is reduced, it is possible to improve the degree of integration of the semiconductor device and to prevent deterioration of characteristics of the semiconductor device due to the change in diameter of the memory hole M.

Therefore, according to the first embodiment, it is possible to appropriately forma structure with a high aspect ratio such as the memory hole M and the memory structure therein.

Second Embodiment

Figure 7:
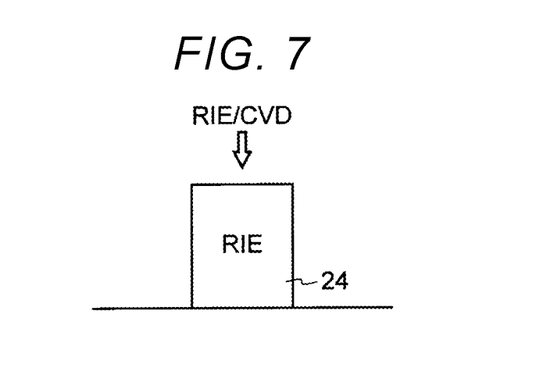
FIG. 7 is a schematic diagram for explaining a method of fabricating a semiconductor device according to a second embodiment.

FIG. 7 is a schematic diagram illustrating a method of fabricating a semiconductor device according to a second embodiment.

In the second embodiment, the RIE processes in the stages of FIGS. 2A, 2C, and 3B and the CVD processes in the stages of FIGS. 2B and 3A are performed in the RIE apparatus 24. That is, an in-situ process is performed in which the RIE apparatus 24 is not opened to the atmosphere during the RIE process and the first metal layer 22 and the second metal layer 23 are also formed by the RIE apparatus 24.

According to the second embodiment, since there is no need to open the RIE apparatus 24 to the atmosphere for the CVD in stage of FIG. 2B or 3A, the stages of FIGS. 2A to 3C can be performed in a short time. This advantage increases as the number of execution times of RIE for processing the memory hole M. Further, the in-situ process of the second embodiment is effective even in a case where a good film quality for the first and second metal layers 22 and 23 is not required.

Third Embodiment

Figure 8:
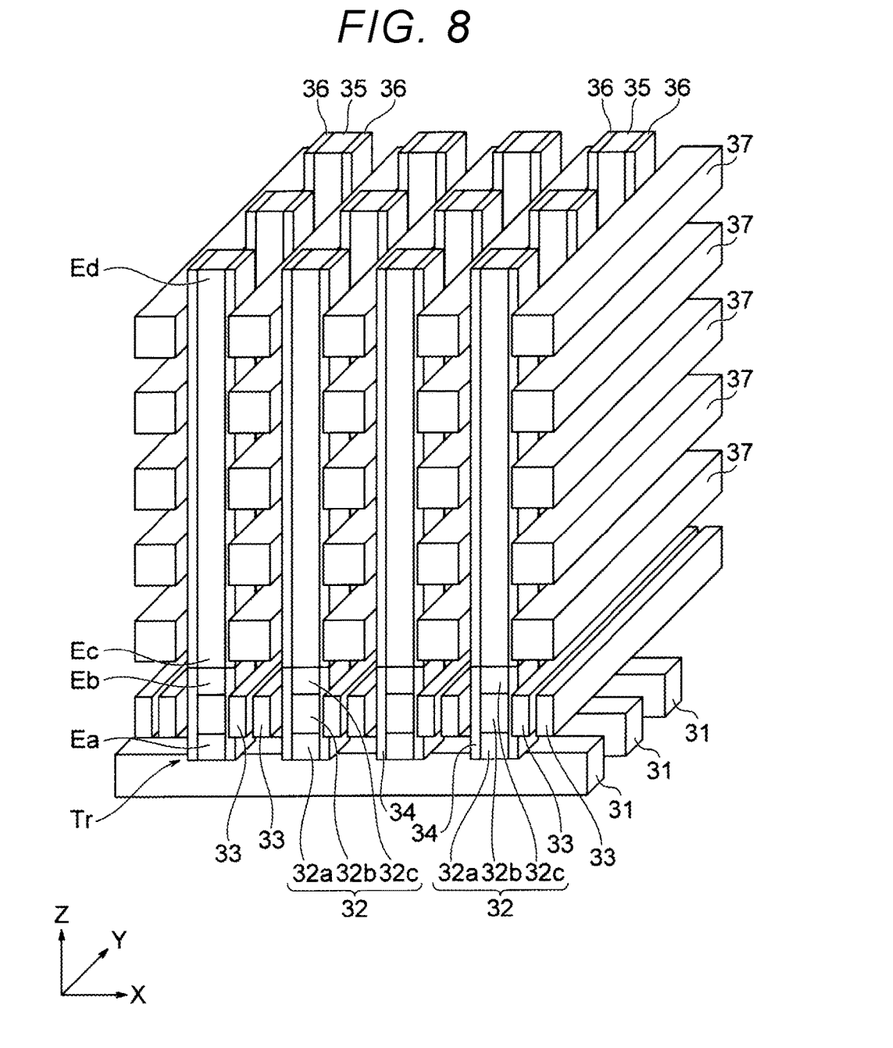
FIG. 8 is a perspective view illustrating a structure of a semiconductor device according to a third embodiment.

FIG. 8 is a perspective view illustrating a structure of a semiconductor device according to a third embodiment. In FIG. 8, the semiconductor device includes a resistive random access memory (ReRAM).

In FIG. 8, the semiconductor device includes a plurality of global bit lines 31. These global bit lines 31 may be formed by, for example, as a part of a silicon substrate, or may be formed of a polysilicon layer provided on the silicon substrate with an insulating film interposed therebetween. Similar to FIG. 1, FIG. 8 illustrates the X direction and the Y direction parallel to the surface of the substrate and perpendicular to each other and the Z direction perpendicular to the surface of the substrate. The global bit lines 31 extend in the X direction.

On each of the global bit lines 31, a plurality of semiconductor members 32 are formed. These semiconductor members 32 are arranged in a matrix form along the X direction and the Y direction. Reference numerals Ea and Eb respectively represent a lower end and an upper end of each semiconductor member 32. The lower end Ea of each semiconductor member 32 is electrically connected to one global bit line 31. Each of the semiconductor members 32 includes an n-type portion 32a formed on one global bit line 31, a p-type portion 32b formed on the n-type portion 32a, and an n-type portion 32c formed on the p-type portion 32b.

The semiconductor device illustrated in FIG. 8 further includes a plurality of gate electrodes 33 extending in the Y direction between the semiconductor members 32. Each of the gate electrodes 33 is provided on an upper part of the n-type portion 32a, the entire of p-type portion 32b, and a lower side surface in the +X direction or a lower side surface in the −X direction of the n-type portion 32c, via a gate insulating film 34.

The gate insulating film 34 is formed on the side surface in the +X direction and the side surface in the −X direction of each semiconductor member 32. As indicated by reference numeral Tr, an n-channel type TFT (Thin Film Transistor) is configured with one semiconductor member 32, a pair of gate electrodes 33, and the gate insulating film 34 between the semiconductor member and the gate electrodes.

On each of the semiconductor members 32, one local bit line 35 having a pillar shape and extending in the Z direction is formed. The local bit line 35 is formed of, for example, a titanium nitride film. Reference numerals Ec and Ed respectively represent a lower end and an upper end of each local bit line 35. The lower end Ec of each local bit line is electrically connected to the upper end Eb of one semiconductor member 32.

On the side surface in the +X direction and the side surface in −X direction of each local bit line 35, a variable resistance film 36 is formed. The variable resistance film 36 is a film having a resistance state which is variable depending on the supplied voltage or current.

In FIG. 8, the semiconductor device further comprises a plurality of word lines 37 extending in the Y direction between the local bit lines 35. A plurality of word lines 37 adjacent to each other in the Z direction are arranged between the local bit lines 35 adjacent to each other in the X direction. The word line 37 is formed of, for example, a titanium nitride film. The variable resistance film 36 is formed between the local bit line 35 and the word line 37.

In the third embodiment, the plurality of electrode layers including these word lines 37 and the plurality of insulating layers for electrical insulation between these electrode layers are alternately formed on the substrate. The method of forming the memory hole M described in the first embodiment is also applicable to the case of forming a hole penetrating through these electrode layers and insulating layers. In this case, the insulating layer is an example of a first film, and the electrode layer is an example of a second film.

According to the third embodiment, it is possible to appropriately form a structure with a high aspect ratio in the ReRAM.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of fabricating a semiconductor device, comprising:
    forming alternately a plurality of first films and a plurality of second films on a substrate;
    forming a hole in the first and second films;
    forming a first metal layer on a surface of the hole;
    removing a portion of the first metal layer located at a bottom surface of the hole;
    forming a second metal layer on a surface of the first metal layer after removing the portion of the first metal layer located at the bottom surface of the hole; and
    processing the bottom surface of the hole remaining exposed from the first and second metal layers to increase a depth of the hole.

2. The method according to claim 1, wherein
the first metal layer comprises titanium, tantalum, or tungsten.

3. The method according to claim 1, wherein
the second metal layer comprises tungsten or aluminum.

4. The method according to claim 1, further comprising:
removing the first and second metal layers from the hole after increasing the depth of the hole; and
forming a conductor layer or a semiconductor layer in the hole after removing the first and second metal layers from the hole.

5. The method according to claim 1, wherein
after the depth increases, the hole includes:
    a first side surface having a tubular shape; and
    a second side surface that is located below the first side surface and has a tubular shape, and
    a seam line disposed between the first side surface and the second side surface.

6. The method according to claim 5, wherein
the second side surface has a maximum diameter larger than a diameter at the seam line.

7. The method according to claim 5, wherein
the second side surface does not have a maximum diameter larger than a diameter at the seam line.

8. The method according to claim 1, wherein
the first and second metal layers are formed in a first apparatus, and the forming the hole, the removing the first metal layer from the bottom surface of the hole, and the processing the bottom surface of the hole are performed in the first apparatus.

9. The method according to claim 1, wherein
the first and second metal layers are formed in a first apparatus, and
the forming the hole, the removing the first metal layer from the bottom surface of the hole, and the processing the bottom surface of the hole are performed in a second apparatus different from the first apparatus.

10. The method according to claim 1, wherein the forming a first metal layer, removing the first metal layer, forming a second metal layer, and processing the bottom surface of the hole are repeated at least once.

11. The method according to claim 1, wherein the processing the bottom surface of the hole comprises reactive ion etching (RIE).

12. The method according to claim 1, wherein the second metal layer is formed selectively on the first metal layer.

13. The method according to claim 1, wherein first and second metal layer are formed by chemical vapor deposition (CVD).

14. The method according to claim 1, wherein the forming a hole forms a hole to a depth D1, the processing the bottom surface forms a hole to a depth D2, and D1/D2 is about 1/4 to 1/2.

15. A semiconductor device comprising:
a plurality of first films and a plurality of second films alternately provided on a substrate; and
a conductor layer or a semiconductor layer provided in the first and second films, wherein
the first and second films have a side surface which has a tubular shape and surrounds the conductor layer or the semiconductor layer,
the side surface of the first and second films comprises:
a first side surface having a tubular shape, and
a second side surface that is located below the first side surface and has a tubular shape, and
a seam line disposed between the first side surface and the second side surface, a diameter of a bottom of the second side surface is smaller than a diameter of the seam line,
wherien the second side surface has a maximum diameter larger than the diameter of the seam line.

* * * * *